US012578178B2

(12) United States Patent
Lee et al.

(10) Patent No.: US 12,578,178 B2
(45) Date of Patent: Mar. 17, 2026

(54) PUPIL IMAGE MEASURING DEVICE AND METHOD

(71) Applicant: SAMSUNG ELECTRONICS CO., LTD., Suwon-si (KR)

(72) Inventors: Seungwoo Lee, Suwon-si (KR); Jinwoo Ahn, Suwon-si (KR); Taejoong Kim, Suwon-si (KR); Myungjun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 286 days.

(21) Appl. No.: 18/232,673

(22) Filed: Aug. 10, 2023

(65) Prior Publication Data

US 2024/0167806 A1 May 23, 2024

(30) Foreign Application Priority Data

Nov. 18, 2022 (KR) ........................ 10-2022-0155797

(51) Int. Cl.
| | |
|---|---|
| *G01B 9/02* | (2022.01) |
| *G01B 9/02015* | (2022.01) |
| *G01N 21/88* | (2006.01) |
| *G01N 21/95* | (2006.01) |
| *G01N 21/956* | (2006.01) |
| *H01L 21/66* | (2006.01) |

(52) U.S. Cl.
CPC ..... *G01B 9/02043* (2013.01); *G01B 9/02032* (2013.01); *G01N 21/8806* (2013.01); *G01N 21/9501* (2013.01); *G01N 21/956* (2013.01); *G01N 2201/0675* (2013.01); *H01L 22/12* (2013.01)

(58) Field of Classification Search
CPC ............ G01B 9/02032; G01B 9/02043; G01N 21/8806; G01N 21/9501; G01N 21/956; G01N 2201/0675
See application file for complete search history.

(56) References Cited

U.S. PATENT DOCUMENTS

| | | | |
|---|---|---|---|
| 10,018,560 B2 * | 7/2018 | Hill ................... | G01N 21/9501 |
| 10,148,893 B2 | 12/2018 | Gupta et al. | |
| 10,288,408 B2 | 5/2019 | Smith et al. | |
| 11,204,330 B1 | 12/2021 | Vaez-Iravani et al. | |

(Continued)

OTHER PUBLICATIONS

Brunner, Elisabeth et al. "Retinal adaptive optics imaging with a pyramid wavefront sensor". Biomed Opt Express, Sep. 2, 2021; 12(10):5969-5990. (Year: 2021).*

(Continued)

*Primary Examiner* — Michael A Lyons
(74) *Attorney, Agent, or Firm* — Sughrue Mion, PLLC

(57) ABSTRACT

Provided is a pupil image measuring device including a light source configured to generate and output a light, a stage on which a measurement target is loaded, an optical system configured to transmit the light output from the light source, to the measurement target, a detector configured to detect a light reflected from the measurement target, and a spatial light distribution controller configured to adjust an intensity or amount of the light output from the light source or the reflected light, for each space of a plurality of spaces of the spatial light distribution controller, wherein the spatial light distribution controller is disposed on a pupil plane.

18 Claims, 8 Drawing Sheets

(56)                    References Cited

U.S. PATENT DOCUMENTS

| | | | |
|---|---|---|---|
| 11,300,524 B1 | 4/2022 | Hill et al. | |
| 2013/0003068 A1 | 1/2013 | Krishnan et al. | |
| 2019/0250094 A1* | 8/2019 | Pandey | G01N 21/8806 |
| 2019/0369505 A1* | 12/2019 | Lian | G03F 7/70633 |
| 2020/0192231 A1 | 6/2020 | Cramer et al. | |
| 2020/0319443 A1 | 10/2020 | Liu et al. | |
| 2021/0124161 A1 | 4/2021 | Montes Usategui et al. | |
| 2022/0012871 A1 | 1/2022 | Kim et al. | |
| 2022/0139743 A1* | 5/2022 | Maleev | H01L 21/67051 |
| | | | 356/445 |
| 2022/0155240 A1 | 5/2022 | Otani et al. | |

OTHER PUBLICATIONS

Vargas, J., et al., "High dynamic range imaging method for interferometry", Optics Communications, 284, (2011) pp. 4141-4145, doi: 10.1016/j.optcom.2011.04.059.

\* cited by examiner

INCIDENCE ANGLE

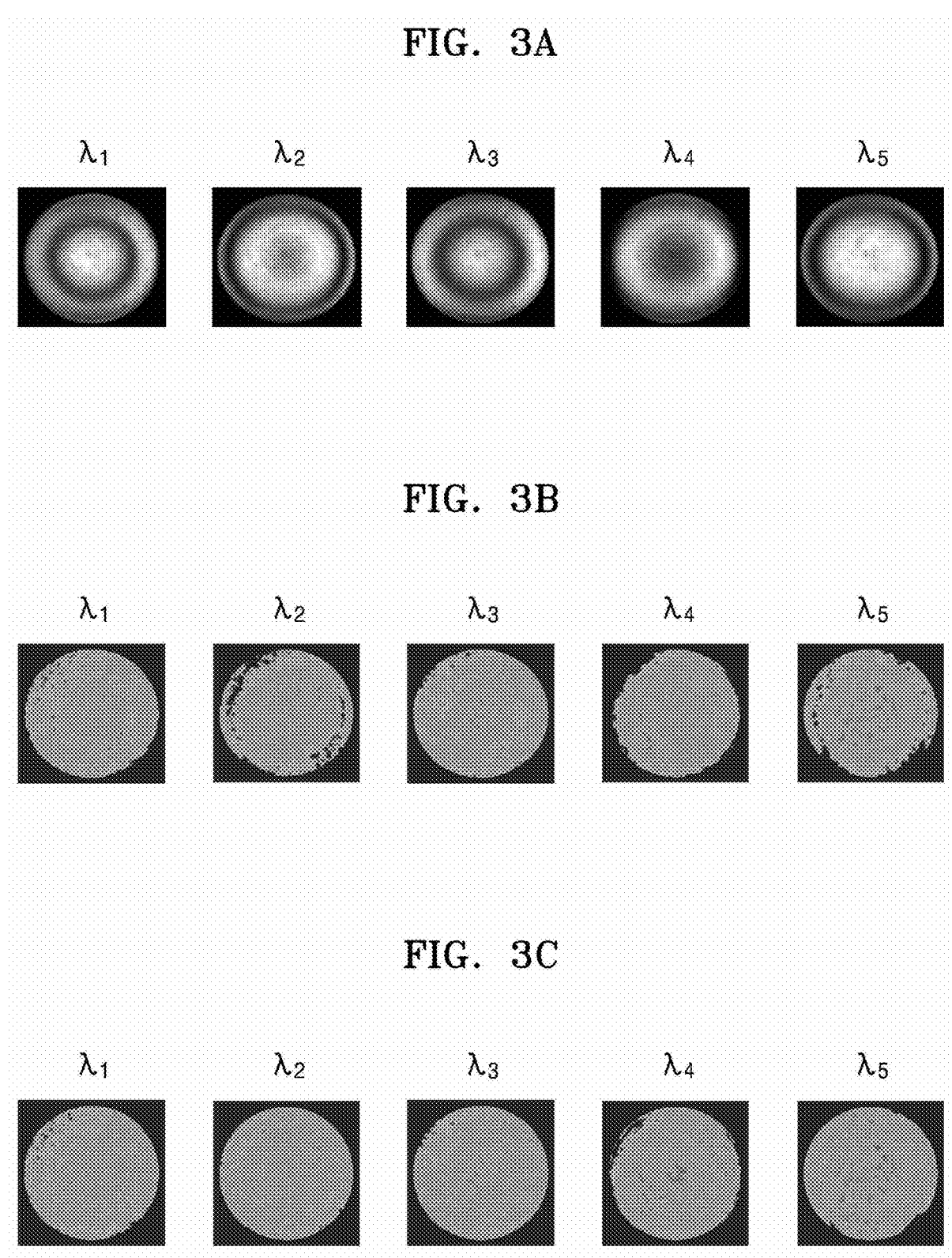

FIG. 4A
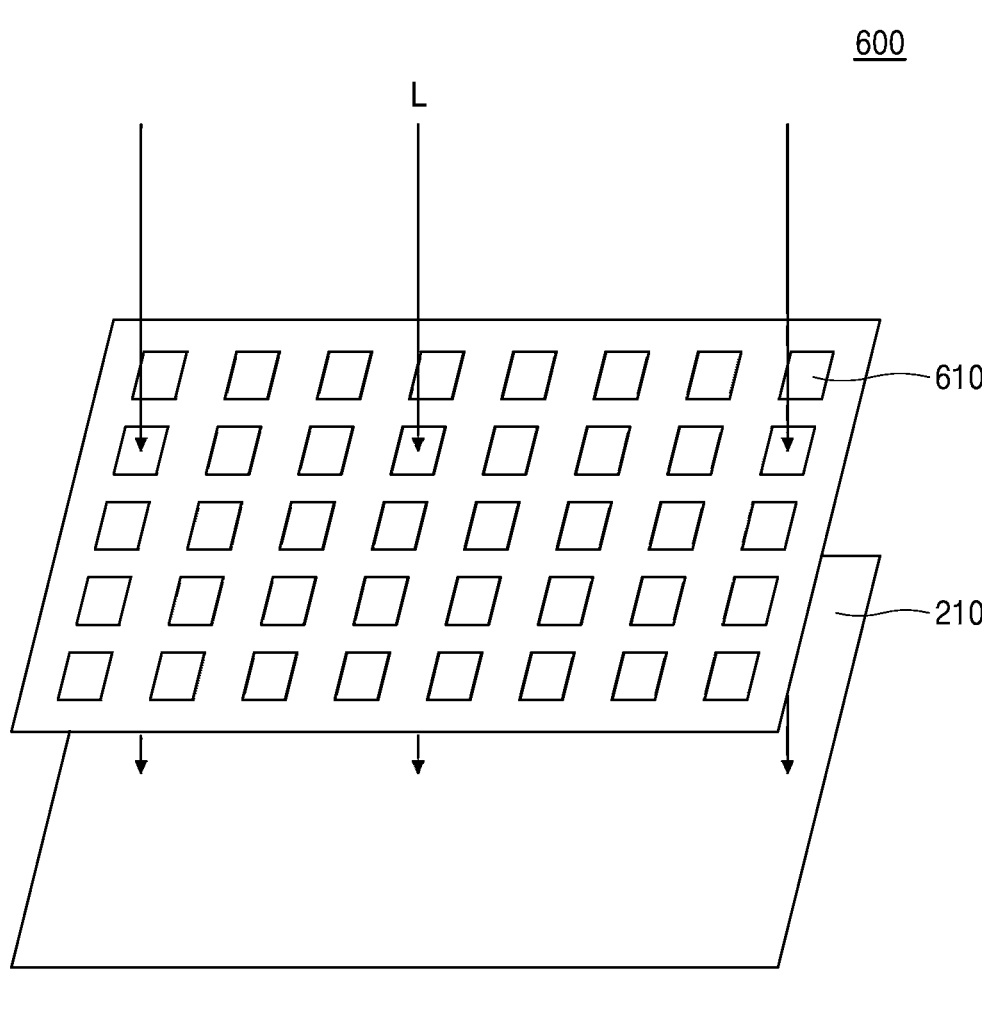
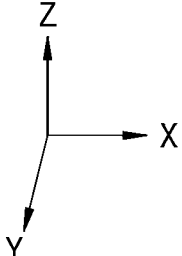

FIG. 4B
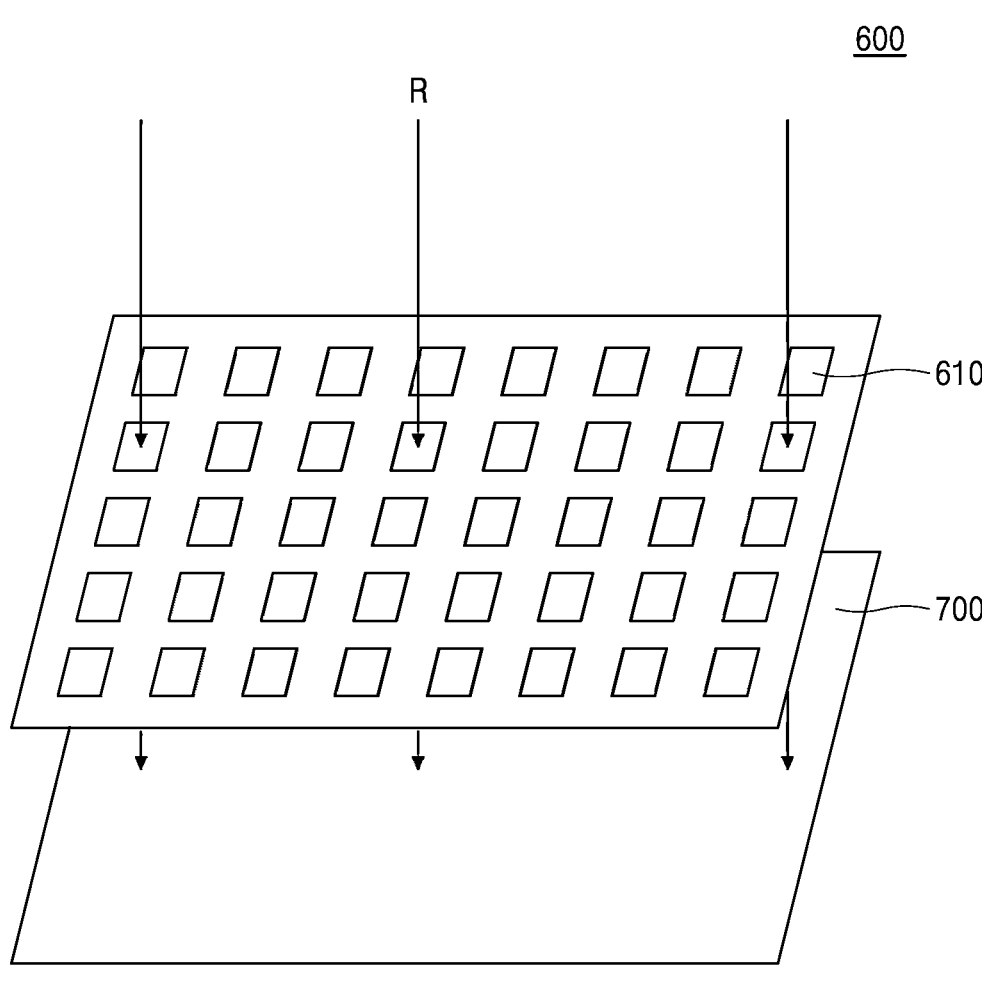
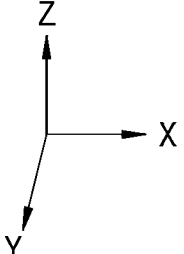

PUPIL IMAGE MEASURING DEVICE AND METHOD

CROSS-REFERENCE TO RELATED APPLICATION

This application is based on and claims priority under 35 U.S.C. § 119 to Korean Patent Application No. 10-2022-0155797, filed on Nov. 18, 2022, in the Korean Intellectual Property Office, the disclosure of which is incorporated by reference herein in its entirety.

BACKGROUND

The embodiments of the disclosure relate to a pupil image-based measurement device and measurement method.

In the current semiconductor manufacturing process, shrinkage of design rules is continuously progressing, and as a result, the size of patterns is decreasing. In addition, in terms of a measuring device for measuring a pattern on a wafer or a mask, problems such as a resolution issue due to a reduced pattern size and a decrease in measurement accuracy may occur. To overcome this, a method for improving an optical resolution is being continuously researched and developed. As a method of improving an optical resolution, there are a short wavelength method and a high numerical aperture (NA) method. In the case of a short wavelength method, there may be limitations due to an insufficient light quantity. In addition, in the case of a high NA method, there may be a physical limit in increasing the size of an objective lens.

SUMMARY

The embodiments provides a pupil imaging measurement device and a method capable of rapidly and precisely measuring a measurement target, and a semiconductor device manufacturing method using the method.

According to an embodiment, there is provided a pupil image measuring device which may include: a light source configured to generate and output a light; a stage on which a measurement target is provided; an optical system configured to transmit the light output from the light source, to the measurement target; a detector configured to detect a light reflected from the measurement target; and a spatial light distribution controller configured to adjust an intensity or amount of a light output from the light source or the reflected light, for each space of a plurality of spaces of the spatial light distribution controller, wherein the spatial light distribution controller is disposed on a pupil plane.

According to an embodiment, there is provided a pupil image measuring device which may include: a light source configured to generate and output a light; an optical system configured to transmit the light from the light source, to a measurement target; a detector configured to detect a light reflected from the measurement target; a spatial light distribution controller configured to adjust an intensity or amount of light output from the light source or the reflected light, for each space of a plurality of spaces of the spatial light distribution controller; and a device controller configured to control, based on a plurality of pupil images obtained by the detector, an operation of the spatial light distribution controller, wherein the optical system includes an objective lens configured to condense the light, and wherein the spatial light distribution controller is disposed on a second pupil lane which is a conjugate pupil plane of a first pupil plane on the objective lens.

According to an embodiment, there is provided a pupil image measuring device which may include: a light source configured to generate and output a light; an optical system configured to transmit the light from the light source to a measurement target; a detector configured to detect a light reflected from the measurement target; a relay lens module configured to transmit the reflected light from the measurement target to the detector; a spatial light distribution controller configured to adjust an intensity or amount of the light output from the light source or the reflected light, for each space of a plurality of spaces of the spatial light distribution controller; and a device controller configured to control, based on a plurality of pupil images obtained by the detector, an operation of the spatial light distribution controller, wherein the optical system comprises an objective lens configured to condense the light, wherein the spatial light distribution controller is disposed on a second pupil plane which is a conjugate pupil plane of a first pupil plane on the objective lens, and wherein the spatial light distribution controller is disposed on the light source or disposed on the detector.

BRIEF DESCRIPTION OF DRAWINGS

Embodiments of the disclosure will be more clearly understood from the following detailed description taken in conjunction with the accompanying drawings in which:

FIGS. 3A to 3C are images illustrating a method of correcting reflectivity of each area of a pupil image in a measurement device according to an embodiment;

FIGS. 4A and 4B are perspective views schematically showing a spatial light distribution controller according to an embodiment;

DETAILED DESCRIPTION OF EMBODIMENTS

Figure 1:
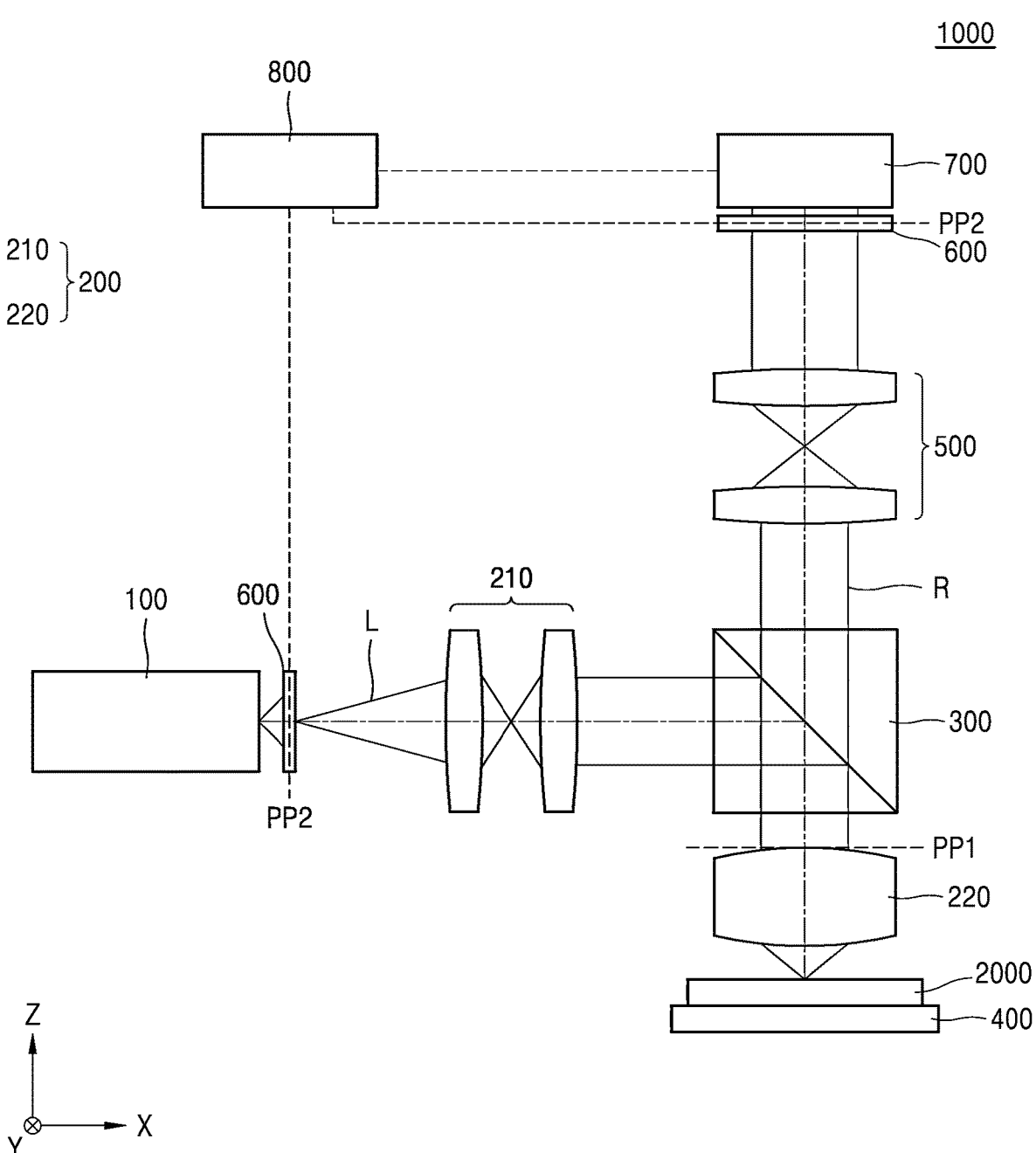
FIG. 1 is a schematic structural diagram of a pupil image measuring device according to an embodiment.

Hereinafter, embodiments of the disclosure will be described in detail with reference to the accompanying drawings. The embodiments described herein are example embodiments, and thus, the disclosure is not limited thereto and may be realized in various other forms. The same reference numerals are used for the same components in the drawings, and duplicate descriptions thereof are omitted. As used herein, an expression "at least one of" preceding a list of elements modifies the entire list of the elements and does not modify the individual elements of the list. For example, an expression, "at least one of a, b, and c" should be understood as including only a, only b, only c, both a and b, both a and c, both b and c, or all of a, b, and c.

FIG. 1 is a structural diagram schematically illustrating a pupil imaging measurement device according to an embodiment.

Referring to FIG. 1, a pupil imaging measurement device 1000 (hereinafter simply referred to as 'measurement device') of the embodiment may include a light source 100, an irradiation optical system 200, a beam splitter 300, a stage 400, a second relay lens module 500, a spatial light distribution controller 600, a detector 700, and a device controller 800.

The measurement device 1000 may measure a semiconductor device using a pupil image. For example, the measurement device 1000 may measure a semiconductor device by ellipsometry, reflectometry, holography, and/or interferometry.

The light source 100 may generate a light of a required wavelength and transmit the light to the irradiation optical system 200. The light source 100 may generate and output a coherent light. The coherent light may refer to a light that causes an interference such as a constructive interference or a destructive interference due to a phase difference when two or more lights overlap each other. The light source 100 may generate and output a broadband light. Meanwhile, according to embodiments, the light source 100 may be implemented by including a plurality of point sources each of which outputs a monochromatic light.

The light source 100 may generate and output lights of various wavelengths. For example, the light source 100 may generate and output a light having a wavelength of about 200 nm such as 248 nm (KrF), 193 nm (ArF), or 157 nm (F$_2$). Of course, the wavelength of the light generated by the light source 100 is not limited to the above wavelengths. For example, the light source 100 may generate and output an extreme ultraviolet (EUV) having a wavelength of several tens of nm.

The irradiation optical system 200 may irradiate a light L incident from the light source 100 to a measurement target 2000 using a plurality of optical elements. In the measurement device 1000, the irradiation optical system 200 may include a first relay lens module 210 and an objective lens 220.

For example, the first relay lens module 210 may include a plurality of lenses, for example, two lenses, and the light L incident on the first relay lens module 210 may be incident to the beam splitter 300. The objective lens 220 may focus the light from the beam splitter 300 to the measurement target 2000, and allow the focused light to be incident. An incidence angle θ of the light focused by the objective lens 220 may be influenced by a numerical aperture (NA) of the objective lens 220. That is, when the refractive index of air is 1, this may have a relationship of NA=sin θ. Therefore, as the NA is closer to 1, the incidence angle is closer to 90°. Due to the focusing action of the objective lens 220, light components incident through different positions of the objective lens 220 may have different incidence angles and different azimuth angles. In the measurement device 1000, the detector 700 may detect, capture or obtain an image on a pupil plane PP of the measurement target 2000, that is, a pupil image. Each pixel of the pupil image corresponds to a different position of the objective lens 220, and thus, may include reflectance information for light components that are incident through different positions of the objective lens 220 and may have different incidence angles and azimuth angles. In FIG. 1, a first pupil plane PP1 disposed on the objective lens 220 is indicated by a dotted line.

The reflected light R reflected from the measurement target 2000 may be incident to the beam splitter 300 through the objective lens 220. The beam splitter 300 may emit the light incident from the first relay lens module 210 toward the objective lens 220, and emit the light reflected from the measurement target 2000 and incident through the objective lens 220 to the second relay lens module 500.

The stage 400 may support and fix the measurement target 2000 on the stage 400. For example, the measurement target 2000 may be disposed on an upper surface of the stage 400, and the stage 400 may support and fix a lower surface of the measurement target 2000. The stage 400 may be a three-dimensional moving stage capable of moving in three dimensions. As the stage 400 moves, the measurement target 2000 may also move. For example, focusing on a vertical axis and/or movement on a horizontal plane with respect to the measurement target 2000 may be performed through movement of the stage 400.

In this specification, a vertical direction (Z direction) may correspond to an extension direction of a normal line perpendicular to the upper surface of the stage 400 or the measurement target 2000, and a horizontal direction (X direction and/or Y direction) may correspond to a direction perpendicular to the extension direction of the upper surface of the stage 400 or the measurement target 2000 or the vertical direction (Z direction).

The measurement target 2000 may be, for example, a mask or a wafer including a pattern. In addition, the measurement target 2000 may be a semiconductor device including multiple pattern layers or overlay marks. The measurement device 1000 may measure and analyze various characteristics of the measurement target 2000. Also, according to an embodiment, the measurement device 1000 may detect defects such as pattern defects or foreign substances in the measurement target 2000.

The second relay lens module 500 may transmit the light from the objective lens 220 to the detector 700. The second relay lens module 500 may include a plurality of lenses, for example, a pair of two lenses. Also, according to embodiments, the second relay lens module 500 may further include at least one optical element.

The spatial light distribution controller 600 may adjust an amount of the light emitted from the light source 100 for each pixel. The spatial light distribution controller 600 may adjust an amount of the light detected by the detector 700 for each pixel. For example, the spatial light distribution controller 600 may have a two-dimensional array shape. The spatial light distribution controller 600 may include a plurality of pixels. A pixel may represent a smallest unit independently driven by the spatial light distribution controller 600 or a basic unit independently controlled in light quantity. Each of a plurality of pixels of the spatial light distribution controller 600 may be selectively operated. For example, each of a plurality of pixels of the spatial light distribution controller 600 may be selectively turned on or off. As will be described later, the spatial light distribution controller 600 may be selectively operated by the device controller 800.

The spatial light distribution controller 600 may be disposed on a second pupil plane PP2. That is, the spatial light distribution controller 600 may be disposed on a conjugate pupil plane of the first pupil plane PP1. For example, the spatial light distribution controller 600 may be disposed on a pupil plane of the light source 100 and/or the detector 700. The spatial light distribution controller 600 may compensate for an incidence angle and/or azimuthal reflectivity of each pixel within a pupil.

For example, the spatial light distribution controller 600 includes a digital micromirror device (DMD), a digital light projection (DLP), a spatial light modulator (SLM), a liquid crystal (LC) array, a liquid crystal on silicon (LCoS), and/or a microlens array.

The detector 700 may detect the light R reflected from the measurement target 2000. In the measurement device 1000, the detector 700 may detect an image on the second pupil plane PP2 for the reflected light R, that is, a pupil image. The second pupil plane PP2 may be a conjugate pupil plane of the first pupil plane PP1. In FIG. 1, the pupil plane for the reflected light R is indicated by a dotted line. The detector 700 may include, for example, a charge-coupled device (CCD) camera, a complementary metal-oxide-semiconductor (CMOS) image sensor, or a photo-multiplier tube (PMT), not being limited thereto.

The detector 700 may synthesize a plurality of pupil images. For example, the detector 700 may synthesize a plurality of pupil images using a high dynamic range (HDR) technique. The detector 700 may synthesize a plurality of pupil images having various exposure times. The detector 700 may synthesize a plurality of pupil images having various wavelengths.

The device controller 800 may be connected to and control the spatial light distribution controller 600 and the detector 700. The device controller 800 may determine whether a light amount distribution of each of the plurality of pupil images detected by the detector 700 is uniform. The device controller 800 may determine whether the light amount distribution of each of the plurality of pupil images is uniform by using Equation 1 below.

$$R_{x,y} = \frac{I_{max} - I_{x,y}}{I_{max}} \qquad \text{<Equation 1>}$$

Here, $R_{x,y}$ may mean reflectivity in each area of the pupil image (e.g., (x,y) coordinate area), Imax may mean a maximum amount of light in each area of the pupil image, and $I_{x,y}$ may mean an amount of light in each area of the pupil image (e.g., (x,y) coordinate area).

According to an embodiment, illustratively, the device controller 800 may compare the maximum amount of light in each area of the pupil image with the amount of light in each area of the pupil image to derive reflectivity of each area of the pupil image. According to an embodiment, the device controller 800 compares an average value, a median value, and/or a mode value of a light intensity of each region of the pupil image with the light intensity of each region of the pupil image to derive the reflectivity of each area of the pupil image.

The device controller 800 may calculate a reflectivity deviation of each pupil image, and compare a calculated result with a preset threshold value. The device controller 800 may control an operation of the spatial light distribution controller 600 when the deviation of reflectivity of each pupil image is greater than a threshold value. For example, the device controller 800 may operate the spatial light distribution controller 600 when the deviation of reflectivity of each pupil image is greater than the threshold value. For example, the device controller 800 may adjust a collected light amount of each of the plurality of pixels of the spatial light distribution controller 600 when the deviation of reflectivity of each pupil image is greater than the threshold value. That is, the device controller 800 may control the operation of the spatial light distribution controller 600 when the deviation of the reflectivity of each area of the pupil image is large.

Conversely, the device controller 800 may maintain the operation of the spatial light distribution controller 600 when the deviation of reflectivity of each pupil image is smaller than the threshold value. That is, the device controller 800 may maintain the operation of the spatial light distribution controller 600 when the deviation of the reflectivity of each area of the pupil image is small. For example, when the spatial light distribution controller 600 does not operate, the device controller 800 may maintain the spatial light distribution controller 600 in an off duty state. For example, when the spatial light distribution controller 600 operates, the device controller 800 may control the amount of light of each pixel of the spatial light distribution controller 600 to be maintained.

The device controller 800 may be implemented in hardware, firmware, software, or any combination thereof. For example, the device controller 800 may be a computing device such as a workstation computer, a desktop computer, a laptop computer, or a tablet computer. For example, the device controller 800 may include a memory device such as Read Only Memory (ROM) and Random Access Memory (RAM), and a processor configured to perform a preset operation and algorithm, for example, a microprocessor, a central processing unit (CPU), a graphics processing unit (GPU), and the like. In addition, the device controller 800 may include a receiver and a transmitter for receiving and transmitting electrical signals. Further, the spatial light distribution controller 600 and the detector 700 may also include a microprocessor and software related thereto configured to perform respective functions or support those functions described herein.

In general measurement devices, the deviation of reflectivity in each area of the pupil image was relatively high. In addition, since a general measurement device requires relatively many measurements to obtain the same brightness, a time to detect a pupil image may be relatively long. In addition, general measurement devices have a problem in that a signal to noise ratio (SNR) of the pupil image is low.

On the other hand, in the measurement device 1000, by disposing a spatial light distribution controller 600 that adjusts the amount of light for each pixel on the second pupil plane PP2 forming a conjugate with the first pupil plane PP1, deviation of reflectivity of each region of the pupil image detected by the detector 700 may be relatively low. Therefore, since the measurement device 1000 requires relatively few measurements to obtain the same brightness, the time required to detect a pupil image may be relatively short. In addition, the measurement device 1000 may improve the SNR of the pupil image by improving the brightness of a relatively dark part of the pupil image.

In reference to FIG. 1, a method of detecting a pupil image by using the reflected light R by the measurement device 1000 has been exemplarily described, but the technical idea is not limited thereto. However, the measurement device 1000 may also detect a pupil image using a scattered light and/or a diffracted light. When the measurement device 1000 uses the scattered light and/or the diffracted light, components of the measurement device 1000 may be modified.

Figure 2:
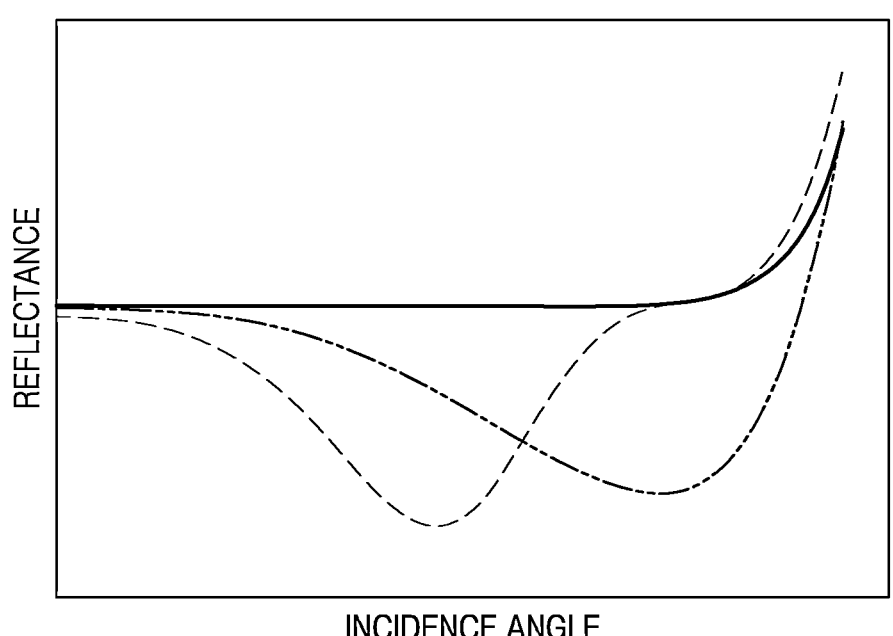
FIG. 2 is a graph showing reflectivity according to an incidence angle in a pupil area, according to an embodiment.

FIG. 2 is a graph showing reflectivity according to an incidence angle in a pupil area, according to an embodiment. In the graph of FIG. 2, a horizontal axis represents the incidence angle of a light, and a vertical axis represents reflectivity of the light. The horizontal axis and the vertical axis are displayed in an arbitrary unit (hereinafter referred to as a.u.).

Referring to FIGS. 1 and 2, the measurement device 1000 may detect the light reflected from the measurement target 2000 by the detector 700. For example, the measurement device 1000 may detect the reflected light R in the detector

700. However, even if a light irradiated to the same measurement target 2000 has different incidence angles to the measurement target 2000, reflectivity of the light may be different. In FIG. 2, only a case where the horizontal axis is the incidence angle is shown, but even when azimuth angles with respect to the measurement target 2000 are different, reflectivity of a light may be different. Accordingly, to compensate for a difference in reflectivity caused by a difference in incidence angle and/or azimuth angle, the spatial light distribution controller 600 may control the incident light L or the reflected light R for each space of a plurality of spaces of the spatial light distribution controller 600. Each of the spaces may correspond to one or more pixels of the spatial light distribution controller 600.

FIGS. 3A to 3C are images illustrating a method of correcting reflectivity of each area of a pupil image in a measurement device according to an embodiment. It will be described with reference to FIG. 1.

Referring to FIG. 3A, first, the detector 700 of the measurement device 1000 detects a plurality of pupil images at different wavelengths. FIGS. 3A to 3C illustrate cases in which the detector 700 detects pupil images at first to fifth wavelengths $\lambda_1$, $\lambda_2$, $\lambda_3$, $\lambda_4$, and $\lambda_5$.

Referring to FIG. 3B, the detector 700 may represent an intensity of reflectivity of a light for each pixel of a plurality of detected pupil images as a color distribution diagram. That is, the detector 700 may express the amount of the light for each pixel of the plurality of detected pupil images as a color distribution diagram. Here, each pixel of the pupil images may correspond to each pixel of the spatial light distribution controller 600.

Referring to FIG. 3C, the device controller 800 controls the spatial light distribution controller 600 to control reflectivity for each pixel of a pupil image. The spatial light distribution controller 600 may be disposed on the second pupil plane PP2. After the device controller 800 controls the spatial light distribution controller 600, the detector 700 may detect a plurality of pupil images at different wavelengths. After that, the detector 700 may display the intensity of reflectivity of the light for each pixel of the plurality of detected pupil images as a color distribution diagram. Comparing FIG. 3B with FIG. 3C, it may be seen that deviation of the reflectivity for each pixel of the plurality of pupil images is reduced.

FIGS. 4A and 4B are perspective views schematically showing a spatial light distribution controller according to an embodiment. FIG. 4A illustratively illustrates a case where the spatial light distribution controller 600 is disposed on the light source 100, and FIG. 4B illustratively illustrates a case where the spatial light distribution controller 600 is disposed on the detector 700.

Referring to FIGS. 1, 4A, and 4B together, a case in which the spatial light distribution controller 600 is a digital micromirror device (DMD) is illustrated as an example. The spatial light distribution controller 600 may include a plurality of micromirrors 610 arranged in a two-dimensional array form. For example, a horizontal area of each micromirror 610 may be the same.

For example, a light generated by the light source 100 may pass through the spatial light distribution controller 600 and may be incident to the first relay lens 210. That is, the spatial light distribution controller 600 may transmit at least a part of the incident light L and allow the part of the incident light L to be incident to the irradiation optical system 200. For example, the light passing through the spatial light distribution controller 600 may be incident to the detector 700. That is, the spatial light distribution controller 600 may transmit at least a part of the reflected light R and allow at least the transmitted part of the reflected light R to be incident to the detector 700. As described above, the spatial light distribution controller 600 may be disposed on the second pupil plane PP2 forming a conjugate with the first pupil plane PP1 of the objective lens 220.

The spatial light distribution controller 600 may include a plurality of micromirrors 610 arranged to adjust angles. One or more micromirrors 610 may be defined as pixels of the spatial light distribution controller 600. The plurality of micromirrors 610 may be turned on/off to selectively reflect and/or transmit an input light. For example, the device controller 800 may turn on/off each of the plurality of micromirrors 610 to selectively reflect and/or transmit the input light. For example, each of the on-duty micromirror 610 and the off-duty micromirror 610 may have different rotation angles.

When the micromirror 610 is in an on-duty state, at least a portion of the light incident on the micromirror 610 may be reflected. When the micromirror 610 is in an off-duty state, all light incident on the micromirror 610 may pass through the micromirror 610. In addition, the amount of light transmitted through the micromirror 610 may be adjusted by adjusting the angle of the micromirror 610.

Operations of each of the plurality of micromirrors 610 of the spatial light distribution controller 600 may be independently controlled. For example, some of the plurality of micromirrors 610 may be in an on-duty state, and some of the plurality of micromirrors 610 may be in an off-duty state. In another embodiment, the angles of each of the plurality of micromirrors 610 may be different from each other.

FIGS. 4A and 4B illustratively illustrate the case where the spatial light distribution controller 600 is a digital micromirror device (DMD), but the disclosure is not limited thereto. As described above, the spatial light distribution controller 600 may include a digital light projection (DLP), a spatial light modulator (SLM), a liquid crystal (LC) array, a liquid crystal on silicon (LCoS), and/or a microlens array, but is not limited thereto.

Figure 5:
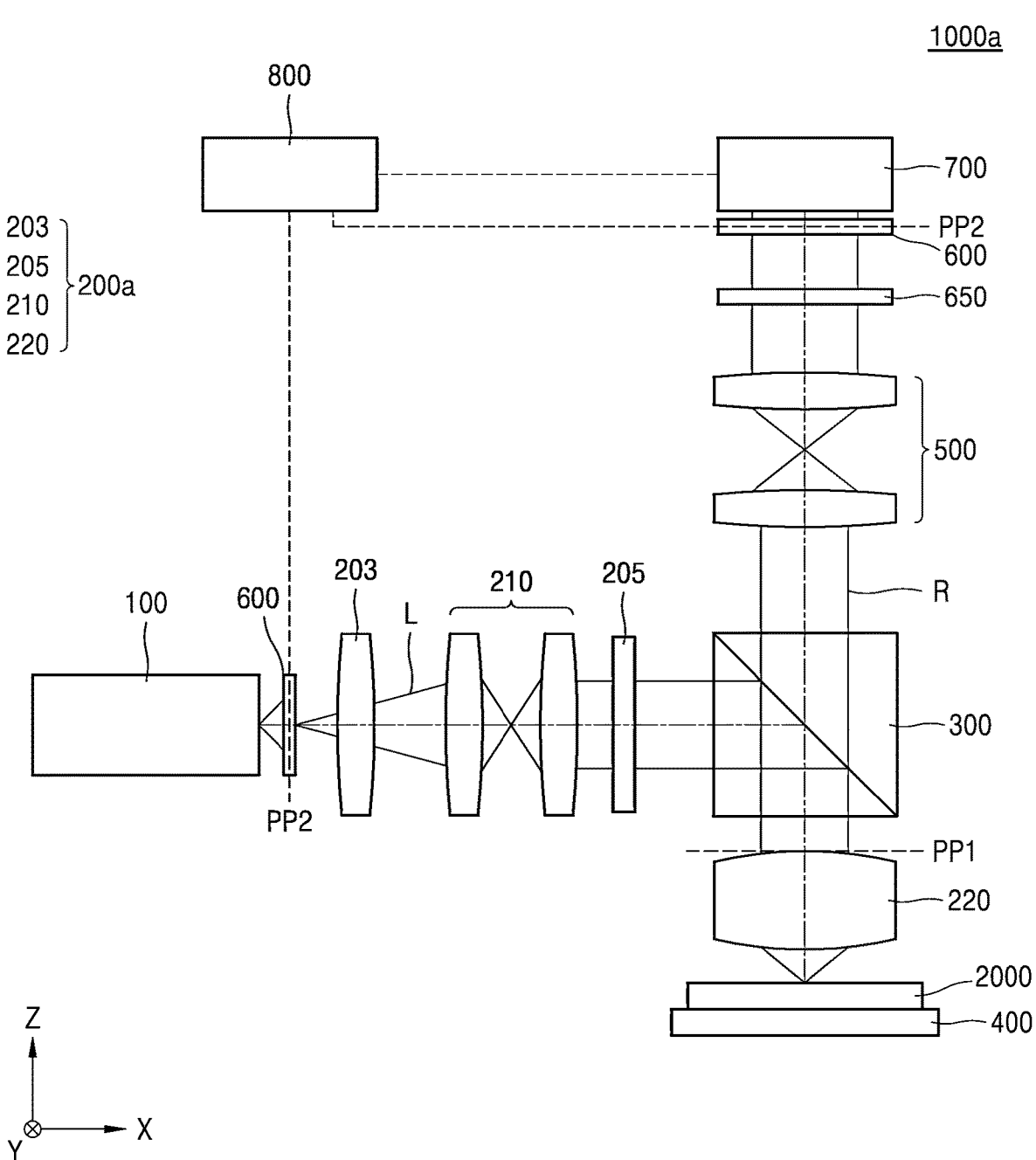
FIG. 5 is a schematic structural diagram of a pupil imaging measurement device according to an embodiment.

FIG. 5 is a schematic structural diagram of a pupil image measuring device according to an embodiment.

Referring to FIG. 5, a pupil image measuring device 1000a (hereinafter simply referred to as a 'measurement device') may include a light source 100, an irradiation optical system 200a, a beam splitter 300, a stage 400, a second relay lens module 500, a spatial light distribution controller 600, an analyzer 650, a detector 700, and a device controller 800. The light source 100, the beam splitter 300, the stage 400, the second relay lens module 500, the spatial light distribution controller 600, the detector 700, and the device controller 800 of FIG. 5 are substantially the same as the light source 100, the beam splitter 300, the stage 400, the second relay lens module 500, the spatial light distribution controller 600, the detector 700 and the device controller 800 of FIG. 1, and here, only the irradiation optical system 200a and the analyzer 650 are described.

The irradiation optical system 200a may include, for example, a collimator 203, a polarizer 205, a first relay lens module 210, and an objective lens 220. The collimator 203 may convert an incident monochromatic light into a parallel light and output the parallel light. The polarizer 205 may polarize and output the light from the collimator 203. Polarization may be, for example, linear polarization. Linear polarization may mean passing only a p-polarized component (or a horizontal component) or an s-polarized component (or a vertical component) of the incident light and converting the incident light into a linearly polarized light.

According to embodiments, the polarizer 205 may perform circular polarization or elliptical polarization.

The analyzer 650 may change a polarization state of a reflected light R. For example, the analyzer 650 may selectively output only a reflected light R having a constant polarization state. The analyzer 650 may include a configuration similar to that of the polarizer 205. For example, the polarizer 205 and/or the analyzer 650 may include a polarizer, a polarizing beam splitter, a polarizing prism, a retarder or a compensator, a birefringent prism, and/or a retarder plate. The analyzer 650 may be disposed between the beam splitter 300 and the second relay lens module 500. The reflected light R passing through the analyzer 650 may be incident to the second relay lens module 500. According to an embodiment, the analyzer 650 may be disposed between the second relay lens module 500 and the detector 700. The reflected light R passing through the analyzer 650 may be incident to the detector 700.

Figure 6:
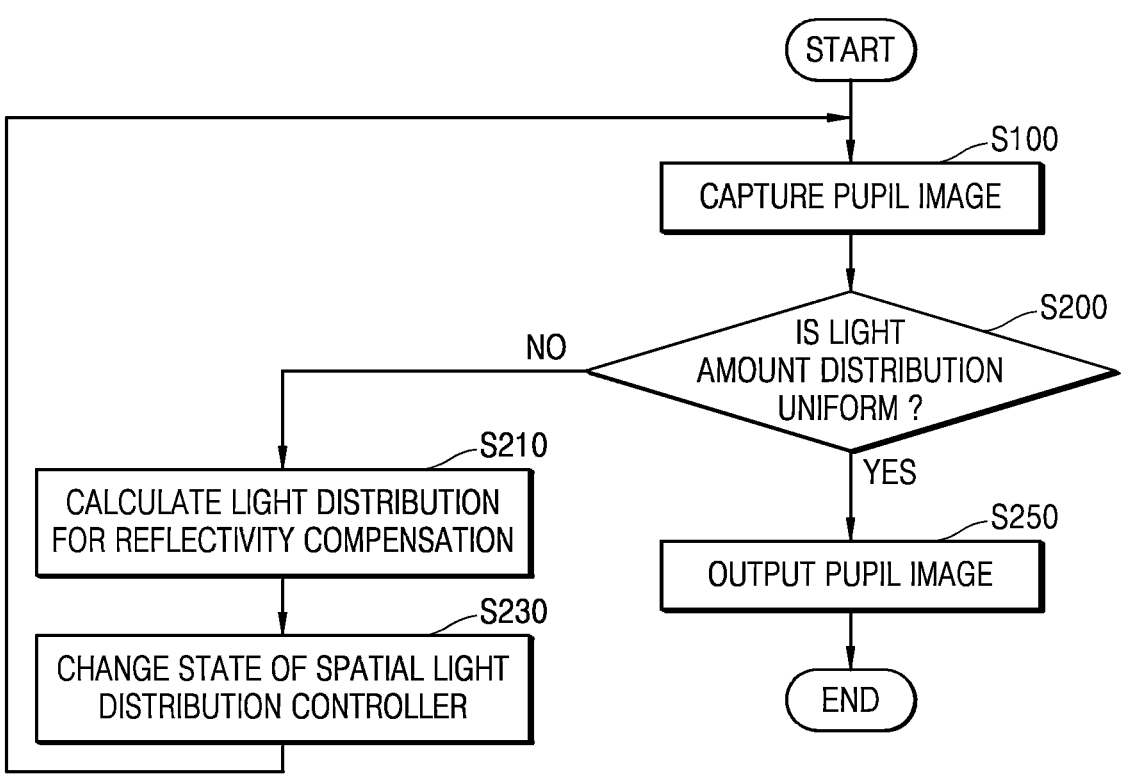
FIG. 6 is a flowchart simply showing a method for measuring a pupil image using a measurement device according to an embodiment.

FIG. 6 is a flow chart simply showing a method for measuring a pupil image using a measurement device according to an embodiment.

Referring to FIGS. 1 and 6, in a pupil image measuring method (hereinafter, simply referred to as 'measurement method'), first, a pupil image is captured using the measurement device 1000 in S100. For example, with the spatial light distribution controller 600 of the measurement device 1000 turned off, the detector 700 may capture a plurality of pupil images.

Next, the device controller 800 determines whether or not a light amount distribution of each pupil image is uniform in S200. For example, the device controller 800 determines whether a reflectance distribution of each pupil image is uniform. The device controller 800 may determine whether the light amount distribution of each of the plurality of pupil images is uniform by using Equation 1 above.

The device controller 800 may calculate a reflectivity deviation of each pupil image and compare a calculated result with a preset threshold value. The device controller 800 may calculate a light distribution for reflectivity compensation when the deviation a of the reflectivity of each pupil image is greater than the threshold value in S210. According to an embodiment, the device controller 800 may calculate a light distribution for reflectivity compensation when 36, which is three times the deviation a of reflectivity of each pupil image, is greater than the threshold value.

Then, the device controller 800 may change a state of the spatial light distribution controller 600 based on the calculated light distribution in S230. For example, the device controller 800 may turn on the spatial light distribution controller 600 when the spatial light distribution controller 600 is turned off. For example, the device controller 800 may adjust the amount of light for each pixel of the spatial light distribution controller 600 when the spatial light distribution controller 600 is turned on.

Also, by repeating S200 to S230, the device controller 800 may control the spatial light distribution controller 600 so that the reflectance distribution of each pupil image is uniform.

The device controller 800 may output a pupil image when the reflectivity deviation a of each pupil image is smaller than the threshold value in S250. After that, the detector 700 may measure the measurement target 2000 by synthesizing a plurality of pupil images.

Figure 7:
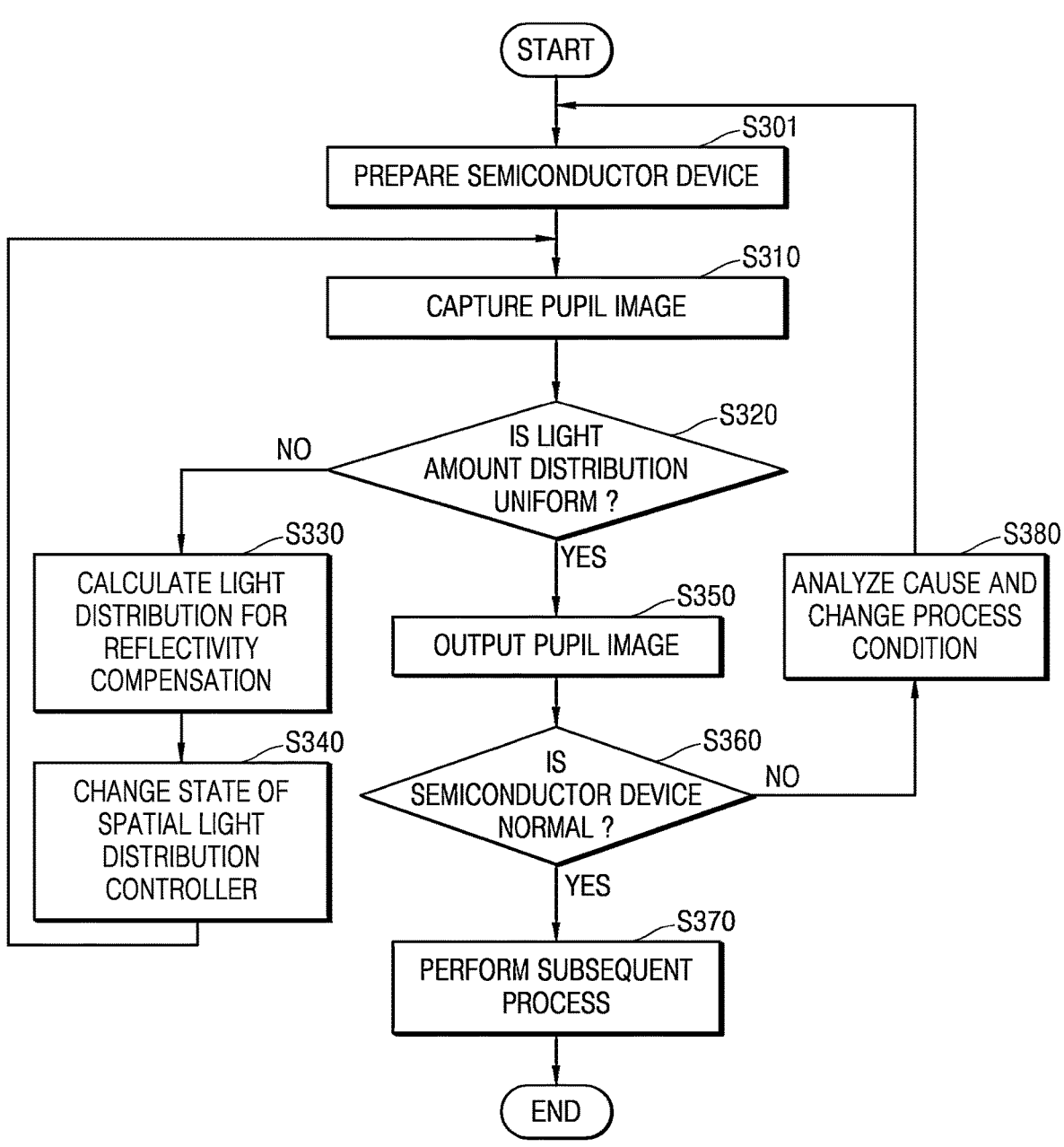
FIG. 7 is a flowchart illustrating a method of inspecting a semiconductor device using a pupil image measurement method according to an embodiment.

FIG. 7 is a flowchart illustrating a method of inspecting a semiconductor device using a pupil image measuring method according to an embodiment.

Referring to FIGS. 1, 6, and 7, in a semiconductor device manufacturing method using a pupil image measurement method of the embodiment (hereinafter, simply referred to as a 'manufacturing method'), first, a semiconductor device as a measurement target is prepared in S301. The semiconductor device may be, for example, a mask or a wafer, or a part corresponding to a shot or chip in the wafer. Of course, the semiconductor device is not limited to the above-mentioned devices. Meanwhile, preparation of the semiconductor device may include a process of manufacturing the semiconductor device.

For example, when the semiconductor device is a mask, the mask includes an array region, and a plurality of repeating patterns may be disposed in the array region. Preparing the semiconductor device in S301 may include a process of forming a pattern in the array region of the mask. For example, in preparing the semiconductor device in S301, a pattern may be formed in an array region of a mask through processes such as pattern design, optical proximity correction (OPC), mask data preparation, and exposure.

In the manufacturing method, after preparing the semiconductor device, operations from capturing a plurality of pupil images in S310 to outputting the pupil image in S350 are sequentially performed. Taking the pupil images in S310, determining whether the light amount distribution of each pupil image is uniform in S320, calculating a light distribution for reflectivity compensation when a deviation a of the reflectivity of each pupil image is greater than a threshold value in S330, changing a state of the spatial light distribution controller 600 in S340 and outputting the pupil image in S350 of FIG. 7 may be substantially the same as taking a pupil image in S100, determining whether the light amount distribution of each pupil image is uniform in S200, calculating a light distribution for reflectivity compensation when the deviation a of the reflectivity of each pupil image is greater than a threshold value in S210, changing the state of the spatial light distribution controller 600 in S230, and outputting the pupil image S250 of FIG. 6, respectively.

Then, based on the measurement result, it is determined whether the semiconductor device is normal in S360. If the semiconductor device is normal (Yes), a subsequent process for the semiconductor device is performed in S370. For example, a subsequent process for a semiconductor device may include a deposition process, an etching process, an ion process, a cleaning process, and the like. Further, a subsequent process for a semiconductor device may include a test process for a semiconductor device at a wafer level. Furthermore, subsequent processes for semiconductor devices may include a process of singulating a wafer into semiconductor chips, and a process of packaging the semiconductor chips.

If the semiconductor device is abnormal (No), the cause is analyzed and the corresponding process conditions are changed in S380. Here, process conditions may mean, for example, process conditions in a semiconductor process for manufacturing a semiconductor device. When taking a lithography process as an example, if the cause is a poor focus, a focus position may be changed, and if the cause is poor dose, the amount of dose may be changed. Thereafter, the process proceeds to S301 to prepare a semiconductor device. The semiconductor device in S301 for preparing the semiconductor device may be a semiconductor device to which changed process conditions are applied.

While a few embodiments have been described with reference to the drawings thereof, it will be understood that various changes in form and details may be made therein without departing from the spirit and scope of the following claims.

What is claimed is:

1. A pupil image measuring device comprising:
a light source configured to generate and output a light;
an optical system configured to transmit the light output from the light source to a measurement target;
a detector configured to detect a light reflected from the measurement target; and
a spatial light distribution controller configured to adjust an intensity or amount of a light output from the light source or the reflected light, for each space of a plurality of spaces of the spatial light distribution controller,
wherein the spatial light distribution controller is disposed on a first pupil plane, the first pupil plane being that of the light source or the detector.

2. The pupil image measuring device of claim 1, wherein the optical system comprises an objective lens,
wherein a second pupil plane disposed on the objective lens is a conjugate pupil plane of the first pupil plane on which the spatial light distribution controller is disposed.

3. The pupil image measuring device of claim 1, wherein the spatial light distribution controller comprises a plurality of pixels corresponding to the plurality of spaces,
wherein each of the plurality of pixels is operated independently of other pixels.

4. The pupil image measuring device of claim 3, further comprising a device controller configured to determine, based on an amount of a light corresponding to each of a plurality of pixels of each of a plurality of pupil images obtained by the detector, an operation state of the spatial light distribution controller, and
wherein each pixel of each pupil image corresponds to each pixel of the spatial light distribution controller.

5. The pupil image measuring device of claim 1, wherein the detector is configured to obtain a plurality of pupil images, and synthesize the plurality of pupil images.

6. The pupil image measuring device of claim 1, further comprising:
a polarizer configured to change a polarization state of the light output from the light source; and
an analyzer configured to change a polarization state of the reflected light.

7. The pupil image measuring device of claim 1, wherein the spatial light distribution controller comprises at least one of a digital micromirror device (DMD), a digital light projection (DLP), a spatial light modulator (SLM), a liquid crystal (LC) array, liquid crystal on silicon (LCoS), and a microlens array.

8. A pupil image measuring device comprising:
a light source configured to generate and output a light;
an optical system configured to transmit the light from the light source to a measurement target;
a detector configured to detect a light reflected from the measurement target;
a spatial light distribution controller configured to adjust an intensity or amount of light output from the light source or the reflected light, for each space of a plurality of spaces of the spatial light distribution controller; and
a device controller configured to control, based on a plurality of pupil images obtained by the detector, an operation of the spatial light distribution controller, wherein the optical system comprises an objective lens configured to condense the light, and
wherein the spatial light distribution controller is disposed on a second pupil plane which is a conjugate pupil plane of a first pupil plane on the objective lens, and
wherein the device controller is configured to determine that a light amount distribution of each of the plurality of pupil images is not uniform, based on determining that a deviation of reflectivity of each of the plurality of pupil images is higher than a preset threshold value.

9. The pupil image measuring device of claim 8, wherein the device controller is configured to control an operation of the spatial light distribution controller based on determining that a light amount distribution of each of the plurality of pupil images is not uniform.

10. The pupil image measuring device of claim 9, wherein the device controller is configured to control a state of each of a plurality of pixels of the spatial light distribution controller, or control an amount of a collected light of each of the plurality of pixels of the spatial light distribution controller.

11. The pupil image measuring device of claim 8, wherein the reflectivity is calculated by comparing a maximum amount of a light in each area of each of the plurality of pupil images with an amount of a light in each area of each of the plurality of pupil images.

12. The pupil image measuring device of claim 11, wherein the reflectivity is calculated by including at least one of an average value, a median value, and a mode value of each region of each of the plurality of pupil images.

13. The pupil image measuring device of claim 8, wherein, based on a light amount distribution of each of the plurality of pupil images being uniform, the detector is configured to synthesize the plurality of pupil images.

14. The pupil image measuring device of claim 8, wherein the detector is configured to synthesize the plurality of pupil images having different exposure times, or synthesize the plurality of pupil images having different wavelengths.

15. The pupil image measuring device of claim 8, wherein the device controller is configured to control the detector to obtain the plurality of pupil images in a state in which the spatial light distribution controller is not operating.

16. A pupil image measuring device comprising:
a light source configured to generate and output a light;
an optical system configured to transmit the light from the light source to a measurement target;
a detector configured to detect a light reflected from the measurement target;
a relay lens module configured to transmit the reflected light from the measurement target to the detector;
a spatial light distribution controller configured to adjust an intensity or amount of the light output from the light source or the reflected light, for each space of a plurality of spaces of the spatial light distribution controller; and
a device controller configured to control, based on a plurality of pupil images obtained by the detector, an operation of the spatial light distribution controller,
wherein the optical system comprises an objective lens configured to condense the light,
wherein the spatial light distribution controller is disposed on a second pupil plane which is a conjugate pupil plane of a first pupil plane on the objective lens, and
wherein the second pupil plane is that of the light source or the detector.

17. The pupil image measuring device of claim 16, wherein the spatial light distribution controller has a plurality of pixels arranged in a two-dimensional array form, and wherein each of the plurality of pixels is operated independently of other pixels.

18. The pupil image measuring device of claim 16, wherein each space of the spatial light distribution controller corresponds to at least one pixel among a plurality of pixels of the spatial light distribution controller, and wherein each pixel of the spatial light distribution controller corresponds to each pixel of each of the plurality of pupil images.

\* \* \* \* \*